(12) United States Patent
McLaurin

(10) Patent No.: US 7,080,299 B2
(45) Date of Patent: Jul. 18, 2006

(54) RESETTING LATCH CIRCUITS WITHIN A FUNCTIONAL CIRCUIT AND A TEST WRAPPER CIRCUIT

(75) Inventor: Teresa Louise McLaurin, Dripping Springs, TX (US)

(73) Assignee: ARM Limited, Cambridge (GB)

( * ) Notice: Subject to any disclaimer, the term of this patent is extended or adjusted under 35 U.S.C. 154(b) by 577 days.

(21) Appl. No.: 10/356,587

(22) Filed: Feb. 3, 2003

(65) Prior Publication Data
US 2004/0153915 A1  Aug. 5, 2004

(51) Int. Cl.
*G01R 31/28* (2006.01)
(52) U.S. Cl. .................................................... 714/726
(58) Field of Classification Search ................ 714/726, 714/729
See application file for complete search history.

(56) References Cited

U.S. PATENT DOCUMENTS

| | | | | |
|---|---|---|---|---|
| 5,271,019 A | * | 12/1993 | Edwards et al. | 714/730 |
| 5,392,297 A | * | 2/1995 | Bell et al. | 714/734 |
| 5,889,788 A | * | 3/1999 | Pressly et al. | 714/726 |
| 6,687,865 B1 | * | 2/2004 | Dervisoglu et al. | 714/726 |
| 6,701,476 B1 | * | 3/2004 | Pouya et al. | 714/727 |
| 6,728,915 B1 | * | 4/2004 | Whetsel | 714/727 |
| 6,877,122 B1 | * | 4/2005 | Whetsel | 714/727 |

OTHER PUBLICATIONS

"Wrapper Design for Embedded Core Test" by Marinissen et al. This paper appears in International Test Conference Proceedings Publication Date: 2000 pp. 911-920 INSPEC Accession No.: 6859181.*

* cited by examiner

*Primary Examiner*—Guy Lamarre
*Assistant Examiner*—Cynthia Britt
(74) *Attorney, Agent, or Firm*—Nixon & Vanderhye P.C.

(57) ABSTRACT

Within an integrated circuit 2 a functional block of circuitry 6 has an associated test wrapper circuit 10. The functional block of circuitry 6 includes functional latches 14 at least some of which may also serve as shared test latches 18 within the test wrapper circuitry 10. Separate reset signals reset_wrp, reset_int are generated for the test latches and shared test latches 18 as distinct from the functional latches 14. Thus, during testing, power consuming activity of the functional latches 14 can be suppressed if it is not desired to test the functional block of circuitry 6 itself. This is a particularly useful technique when a functional block of circuitry 6 is required to operate in an extest mode in which output signals from it are required to be driven so that other elements in the overall design may be tested and yet the internal action of the functional block of circuity 6 is not under test.

20 Claims, 2 Drawing Sheets

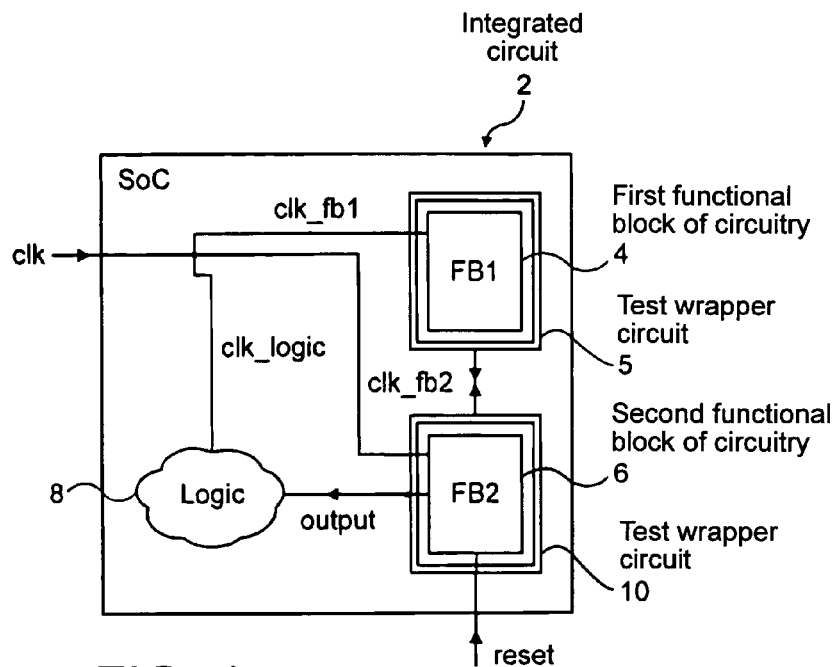
FIG. 1 *(Prior Art)*
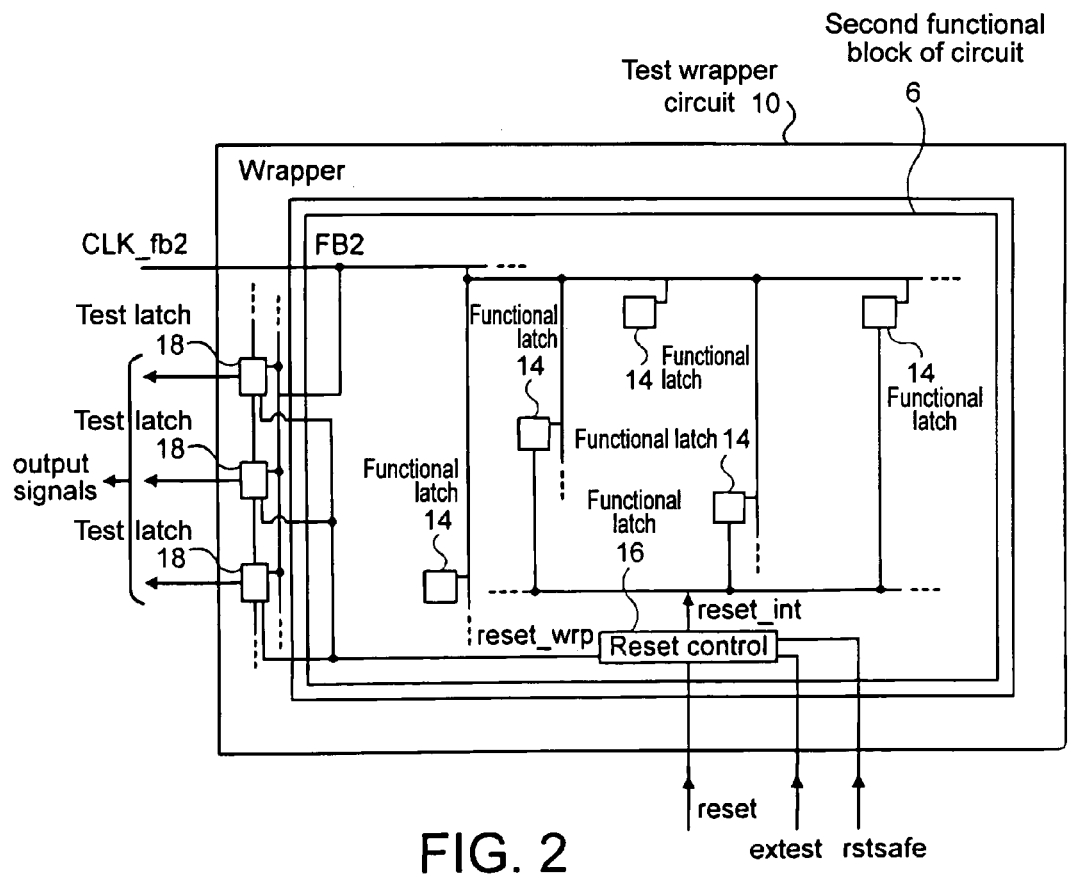
FIG. 2

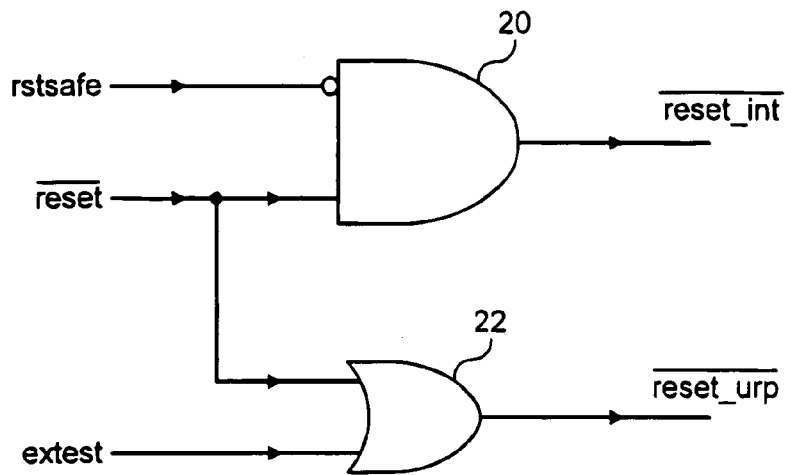
FIG. 3
| extest | reset | rstsafe | reset_int | reset_wrp |
|--------|-------|---------|-----------|-----------|
| 0 | 0 | 0 | 0# | 0* |
| 0 | 0 | 1 | 0# | 0* |
| 0 | 1 | 0 | 1 | 1 |
| 0 | 1 | 1 | 0# | 1 |
| 1 | 0 | 0 | 0# | 1 |
| 1 | 0 | 1 | 0# | 1 |
| 1 | 1 | 0 | 1 | 1 |
| 1 | 1 | 1 | 0# | 1 |
* Wrapper reset occurs
Internal reset occurs
FIG. 4
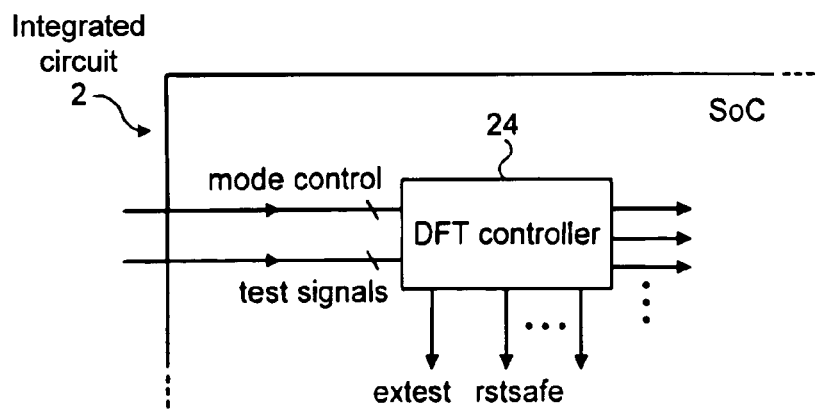
FIG. 5

RESETTING LATCH CIRCUITS WITHIN A FUNCTIONAL CIRCUIT AND A TEST WRAPPER CIRCUIT

BACKGROUND OF THE INVENTION

1. Field of the Invention

This invention relates to the field of data processing systems. More particularly, this invention relates to data processing systems having a functional circuit with an associated test wrapper circuit both containing latches with associated reset inputs.

2. Description of the Prior Art

It is known to provide test methodologies which utilise a test wrapper circuit comprising a plurality of test latches surrounding a functional circuit block within a larger integrated circuit. As an example, the functional circuit block may be a processor core which forms part of a system-on-chip design comprising several other circuit elements or blocks. The test wrapper allows test signals to be applied to the processor core to check it for correct operation and also allows test signals to be driven from the test wrapper surrounding the functional circuit to other elements within the system-on-chip design during an "extest" mode. This type of test methodology is the subject of the IEEE Standard P1500 which is currently under discussion.

As system-on-chip designs become larger and more complicated, the power consumption of such devices during testing can become a problem. More particularly, in their normal functional mode of operation the power consumption may be significantly below the power consumption which can occur during testing as during testing the circuits adopt states which would not normally occur during the functional mode. If the power supply of the design has been provided to meet the requirements of the functional mode, it may be that it is insufficient to properly meet the power requirements during testing and this can lead to erroneous test results and/possible circuit damage. Accordingly, measures which can allow the power consumption of a design to be reduced when it is being tested are advantageous.

One way of reducing power consumption during test is to disable operation of one or more functional blocks of circuitry not required to be active during certain tests, e.g. through clock gating and the like. However, in complicated designs clock gating can often introduce significant complications in the timing of the circuits and is undesirable in functional mode operation. This overrides its usefulness during testing. However, if a functional block of circuitry can be disabled in a manner that reduces its power consumption, it is possible for its associated test wrapper circuit to be used in an extest mode to generate output signals that are applied to other circuits within the design simulating the signals that would be generated by the disabled functional block of circuitry during functional mode operation.

Another design consideration for systems incorporating test wrapper circuits is that the circuit area overhead associated with the test wrapper should desirably be small. One way of helping to achieve this is to reuse latches that are part of the functional circuitry to also serve as latches within the test wrapper circuitry.

SUMMARY OF THE INVENTION

Viewed from one aspect the present invention provides apparatus for processing data, said apparatus comprising:

a functional circuit having a plurality of functional latches operable in a functional mode to store respective functional signal values;

a test wrapper circuit having a plurality of test latches; and a reset control circuit coupled to reset inputs of one or more of said plurality of functional latches and at least one of said plurality of test latches, said reset control circuit being:

(i) operable in said functional mode to respond to a functional mode reset signal to reset said one or more of said plurality of functional latches and said at least one of said plurality of test latches; and (ii) operable in said test mode to allow reset of said one or more of said plurality of functional latches whilst not resetting said at least one of said plurality of shared test latches.

The present invention both recognises and solves a power consumption problem that arises when using test wrappers, particularly, but not exclusively, those having shared test latches. In a significant number of circuit designs it is not possible to use clock gating to switch off, or hold static, portions of the overall circuit since no clock gating may be provided at any level or clock gating may not be provided at a level which separates the circuit elements which one wishes to clock during the test from circuit elements which one does not wish to clock during the test. Furthermore, the present invention recognises that merely asserting a reset signal to a functional block of circuitry in which it is desired to suppress activity will not work when there are shared test latches which serve as functional latches in the functional circuitry and are responsive to reset signals in the functional mode since these will be incorrectly reset during the test mode if a reset is used to try to suppress circuit activity. The solution provided by the present technique is to modify the reset behaviour to act differently in the functional mode and the test mode such that in the functional mode both functional latches and test latches are reset whereas in the test mode the functional latches are reset, and so their activity and power consumption suppressed, whilst at least some test latches (e.g. shared test latches) are not reset.

In preferred embodiments a safe reset signal is provided to the reset control circuit to trigger resetting of some of the functional latches whilst not resetting the shared test latches. This safe reset signal could be externally applied through a pin or internally generated, such as from a designed-for-test (DFT) controller.

The resetting of shared test latches by the normal functional mode reset signal can be blocked in preferred embodiments by a test mode indicating signal which may gate the normal reset signal path. Thus, whilst in a test mode, even if the functional mode reset signal should be asserted for some reason, e.g. whilst scanning in or scanning out test data, this will not reset the shared test latches.

The control of whether the apparatus is in a functional mode or a test mode may conveniently be made by external test control signals applied to a test controller. This test controller in turn may advantageously generate the test mode indicating signal.

In preferred embodiments of the invention the functional circuit is part of an integrated circuit and generates at least one output signal that is passed to another functional circuit of the integrated circuit. In such embodiments the functional circuit may be operable in an external test mode in which it is desirable to suppress its internal operation so as to reduce its power consumption whilst still generating its output signals so that these can be applied to other functional blocks within the overall system. The shared test latches can serve to store test signals that provide these outputs in place of the output signals that would in functional mode operation be produced by the functional circuit. In this context, whilst the functional latches of the functional circuit may be held in reset to lower their power consumption, the shared test latches which are generating the output signals should not be reset if proper external test operation is to be achieved.

Viewed from another aspect the present invention provides a method of operating an apparatus for processing data, said method comprising the steps of:

in a functional mode storing a plurality of functional signal values in respective functional latches of a functional circuit;

in a test mode storing a test signal value in a shared test latch of a test wrapper circuit, said shared test latch serving as a functional latch in said functional mode;

in said functional mode, responding to a functional mode reset signal to reset one or more of said plurality of functional latches and said shared test latch; and in said test mode, allowing reset of said one or more of said plurality of functional latches whilst not resetting said shared test latch.

The above, and other objects, features and advantages of this invention will be apparent from the following detailed description of illustrative embodiments which is to be read in connection with the accompanying drawings.

BRIEF DESCRIPTION OF THE DRAWINGS

FIG. 1 schematically illustrates an integrated circuit including multiple functional circuit blocks, at least one of which has a test wrapper circuit;

FIG. 2 schematically illustrates a function block with a test wrapper circuit showing latches within the wrapper circuit and latches within the functional block;

FIG. 3 is a circuit diagram illustrating logic gates for generating a functional latch reset signal and a test wrapper reset signal;

FIG. 4 is a table illustrating the relationship between input signals and output signals for the circuit of FIG. 3; and FIG. 5 schematically illustrates a test controller.

DESCRIPTION OF THE PREFERRED EMBODIMENTS

FIG. 1 schematically illustrates an integrated circuit 2 which is a system-on-chip design comprising a first functional block of circuitry 4, a second functional block of circuitry 6 and some further logic circuitry 8. As illustrated, the second functional block of circuitry 6 is associated with a test wrapper circuit 10 which can be used for testing purposes. The first functional block of circuitry 4 also has an associated test wrapper circuit 5. The test wrapper circuit may be one designed and operated in accordance with the techniques described in the proposed IEEE Standard P1500.

The integrated circuit 2 is illustrated as having a clock signal clk input to it and supplied to the first functional block of circuitry 4, the second functional block of circuitry 6 and the logic 8. The test wrapper circuit 10 and the second functional block of circuitry 6 are supplied with a common clock signal clk_fb2. For design and timing reasons, this clock signal clk_fb2 is not gated or divided and accordingly if the test wrapper circuitry 10 is being supplied with a clock signal, then the second function block of circuitry 6 with which it is associated will also be supplied with a clock signal. Thus, in this embodiment clock gating cannot be used to disable the second functional block of circuitry 6 whilst leaving its associated test wrapper circuitry 10 active.

The second functional block of circuitry 6 is illustrated as generating at least one output signal that is supplied to the logic 8. If it is desired to test the operation of the logic 8, then it may need to be supplied with the output signal from the second functional block of circuitry 6 in order to operate correctly. Thus, either the second functional block of circuitry 6 needs to be normally operating or at least its associated test wrapper circuitry 10 needs to be in an "extest" mode (external test) where it can generate an output signal(s) replacing that normally produced by the functional circuitry in accordance with a test signal stored within the test wrapper circuitry 10. However, as previously mentioned, if the test wrapper circuitry 10 is being clocked and is active so as to generate necessary output signal in the extest mode, then the second functional block of circuitry 6 will also be being supplied with clock signals and accordingly will consume power in a manner that may be undesired and/or disadvantageous. The test wrapper circuits 5 and 10 may also be used to test the interconnections between the first functional block of circuitry 4 and the second functional block of circuitry 6.

FIG. 2 schematically illustrates the second functional block of circuitry 6 and its associated test wrapper circuitry 10. The second functional block of circuitry 6 includes multiple functional latches 14 at various points. It will be appreciated that there will typically be many thousands of such latches within a complex functional block of circuitry such as a microprocessor. As illustrated, all of the functional latches 14 are supplied with the clock signal clk_fb2. Some of the functional latches 14 are also supplied with a reset signal reset_int generated by a reset controller 16. It is not necessary for all of the functional latches 14 to be subject to this reset signal reset_int for their normal operation. This reset signal reset_int can be used to suppress the activity of the latches during a test operation as will be described later. Whilst the activity of not all of the functional latches 14 may be suppressed, at least some power saving will be achieved by suppressing the activity of a proportion of the functional latches 14. If power saving during test becomes a still more critical requirement, then it is possible that the design of the second functional block of circuitry 6 could be modified such that all of the functional latches 14 were supplied with the reset signal reset_int such that their activity could be suppressed during test modes.

The wrapper circuitry 10 includes a plurality of serially connected test latches 18 which can be operated in accordance with the proposed IEEE P1500 Standard techniques. As is known, in order to reduce the circuit overhead requirements associated with test operation, at least some of the test latches 18 may be shared test latches in that they also are utilised during a functional mode to serve as functional latches in normal operation. An example would be a latch that serves to store an output signal of the second functional block of circuitry 6 during functional mode operation which is reused during test operation to store a test signal associated with that output. The test latches 18 illustrated in FIG. 2 are all shared test latches associated with output signals that are supplied to the logic 8 of FIG. 1. The shared test latches 18 are clocked by the clock signal clk_fb2 which also clocks the functional latches 14. There is no separate clock signal provided for the shared test latches 18 compared with the functional latches 14 which are not shared between functional and test mode. The shared test latches 18 are all supplied with their own reset signal reset_wrp that serves to reset the test latches of the test wrapper circuitry 10. This reset signal reset_wrp is also generated by the reset controller 16.

The reset controller 16 generates the reset signal reset_int for the functional mode only functional latches 14 and the reset signal reset_wrp for the test latches 18 in response to an externally generated functional mode reset signal (reset) as well as a signal indicating whether or not the integrated circuit is currently in an external test mode (extest), as well as a signal (rstsafe) indicating that a reset of the functional latches 14 is desired for power reduction during test.

FIG. 3 illustrates example logic that may be provided within the reset controller 16. This comprises an AND gate 20 and an OR gate 22. The functional mode reset signal (reset) is an active low signal as are the reset signal for the test wrapper latches (reset_wrp) and the reset for the functional latches (reset_int). It will be appreciated that other embodiments of the present technique may not require the OR gate 22.

FIG. 4 illustrates the various possible combinations of the inputs to the circuit of FIG. 3 together with the resulting outputs. With regard to the reset signal for the test wrapper circuitry 10, it will be seen that this is not active to produce a reset of the test latches 18 in any circumstance when the test mode indicating signal indicates that the extest mode is current. When not in extest mode, then the OR gate 22 will trigger a reset of the test latches 18 when the functional mode reset signal (reset) is low.

With regard to the reset signal (reset_int) for the functional latches 14, this is independent of the test mode indicating signal (extest). All combinations of the functional mode reset signal and the reset safe signal (rstsafe) will result in a reset of the functional latches 14 other than the one in which the functional mode reset signal is high and the reset safe signal is low. It should be noticed that if the reset safe signal rstsafe is high then a reset of the functional mode latches 14 will be forced irrespective of the state of the functional mode reset signal (reset) by virtue of the action of the AND gate 20. Thus, when testing the integrated circuit 2 of FIG. 1, if the reset safe signal rstsafe is asserted, then at least a proportion of the functional mode latches 14 within the second functional block of circuitry 6 will be forced into a reset state and so reduce power consumption irrespective of the state of the function mode reset signal reset. Furthermore, this resetting of the functional mode latches 14 can be achieved without resetting the test latches 18 and in particular the shared test latches. Thus the test latches and shared test latches can continue to provide their proper test functions.

FIG. 5 illustrates a design-for-test controller 24 which may be provided within the integrated circuit 2 to co-ordinate and drive testing operations. In particular, this design-for-test controller 24 can receive mode controlling signals and test data signals and then use these to generate test controlling signals such as the previously mentioned extest and rstsafe signals as well as supply the test data signals to the appropriate portions of the integrated circuit 2 under test. In this example, the mode control signals to the design-for-test controller 24 may select an extest mode which will result in the extest signal being asserted. An appropriate command or mode will indicate a desire to suppress the switching of the functional mode latches 14 within the second functional block of circuitry 6 and accordingly that the rstsafe signal should be asserted for supply to the reset controller 16.

It will be appreciated that in the above embodiment the resetting of the function latches 14 whilst the test latches and shared test latches 18 continue to be active has been described in relation to an extest mode. The suppression of the functional mode latches may also be desirable in other situations during testing.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

I claim:

1. Apparatus for processing data, said apparatus comprising:
   a functional circuit having a plurality of functional latches operable in a functional mode to store respective functional signal values;
   a test wrapper circuit having a plurality of test latches; and
   a reset control circuit coupled to reset inputs of one or more of said plurality of functional latches and at least one of said plurality of test latches, said reset control circuit;
   (i) when operating in said functional mode responsive to a functional mode reset signal for resetting said one or more of said plurality of functional latches and said at least one of said plurality of test latches; and
   (ii) when operating in said test mode allowing reset of said one or more of said plurality of functional latches whilst not resetting said at least one of said plurality of test latches.

2. Apparatus as claimed in claim 1, wherein said plurality of test latches include one or more shared test latches which serve as a functional latch in said functional mode.

3. Apparatus as claimed in claim 2, wherein said functional circuit is operable in said functional mode to generate at least one output signal and a shared test latch is operable in an external test mode to store a respective test signal value that is output in place of said output signal.

4. Apparatus as claimed in claim 2, wherein said test wrapper circuit includes a plurality of shared test latches.

5. Apparatus as claimed in claim 1, wherein in said test mode, said reset control circuit is responsive to a safe reset signal to reset said one or more of said plurality of functional latches whilst not resetting said at least one of said plurality of test latches, said safe reset signal separate from said functional mode reset signal.

6. Apparatus as claimed in claim 5, comprising a test controller responsive to external test control signals to control whether said apparatus is in said functional mode or said test mode and to generate said safe reset signal.

7. Apparatus as claimed in claim 6, wherein said test controller generates said test mode indicating signal.

8. Apparatus as claimed in claim 1, wherein in said test mode said reset control circuit is responsive to a test mode indicating signal, to selectively block said functional mode reset signal from resetting said at least one of said plurality of test latches.

9. Apparatus as claimed in claim 1, wherein said functional circuit is part of an integrated circuit and generates at least one output signal that is passed to another functional circuit of said integrated circuit.

10. Apparatus as claimed in claim 1, wherein said test latches provide a serial test scan path for test signals.

11. A method of operating an apparatus for processing data, said method comprising the steps of:

in a functional mode, storing a plurality of functional signal values in respective functional latches of a functional circuit;

in a test mode, storing a test signal value in a test latch of a test wrapper circuit;

in said functional mode, in response to a functional mode reset signal, resetting one or more of said plurality of functional latches and said test latch; and in said test mode, allowing reset of said one or more of said plurality of functional latches whilst not resetting said test latch.

12. A method as claimed in claim 11, wherein said test latch is a shared test latch which also serves as a functional latch in said functional mode.

13. A method as claimed in claim 12, wherein said functional circuit is operable in said functional mode to generate at least one output signal and a shared test latch is operable in an external test mode to store a respective test signal value that is output in place of said output signal.

14. A method as claimed in claim 12, wherein said test wrapper circuit includes a plurality of shared test latches.

15. A method as claimed in claim 11, wherein in said test mode, the step of responding to a safe reset signal to reset said one or more of said plurality of functional latches whilst not resetting said test latch, said safe reset signal separate from said functional mode reset signal.

16. A method as claimed in claim 15, comprising responding to external test control signals to control whether said apparatus is in said functional mode or said test mode and to generate said safe reset signal.

17. A method as claimed in claim 16, wherein a test controller generates said test mode indicating signal.

18. A method as claimed in claim 11, wherein in said test mode, the step of responding to test mode indicating signal, said test mode indicating signal for selectively blocking said functional mode reset signal from resetting said test latch.

19. A method as claimed in claim 11, wherein said functional circuit is part of an integrated circuit and generates at least one output signal that is passed to another functional circuit of said integrated circuit.

20. A method as claimed in claim 11, wherein said test latches provide a serial test scan path for test signals.

* * * * *